United States Patent [19]

Taylor

[11] Patent Number: 5,306,964

[45] Date of Patent: Apr. 26, 1994

[54] REFERENCE GENERATOR CIRCUIT FOR BICMOS ECL GATE EMPLOYING PMOS LOAD DEVICES

[75] Inventor: Gregory F. Taylor, Portland, Oreg.

[73] Assignee: Intel Corporation, Santa Clara, Calif.

[21] Appl. No.: 20,651

[22] Filed: Feb. 22, 1993

[51] Int. Cl.$^5$ .................. H03K 19/02; H03K 19/086
[52] U.S. Cl. ................................ 307/446; 307/296.7;
307/475; 307/455
[58] Field of Search .............. 307/296.6, 296.7, 296.8,
307/455, 475, 446

[56] References Cited

U.S. PATENT DOCUMENTS

| | | | |
|---|---|---|---|
| 4,128,816 | 12/1978 | Shimotsuma | 307/296.7 |
| 4,593,208 | 6/1986 | Single | 307/296.7 |
| 4,794,317 | 12/1988 | van Tran | 307/446 |
| 5,001,362 | 3/1991 | Tran | 307/296.7 |
| 5,034,626 | 7/1991 | Pirez et al. | 307/296.7 |
| 5,197,358 | 1/1993 | Martin | 307/296.7 |

Primary Examiner—David R. Hudspeth
Assistant Examiner—Richard Roseen
Attorney, Agent, or Firm—Blakely, Sokoloff, Taylor & Zafman

[57] ABSTRACT

A reference circuit for coupling to a particular type of BiCMOS logic gate includes a $V_{be}$ multiplier coupled between $V_{CC}$ and a first internal node. The multiplier establishes a predetermined potential at the internal node which determines the voltage swing across the PMOS load devices utilized in the BiCMOS logic gate. A first PMOS transistor, configured as a current source within the multiplier, has its source coupled to the internal node. A second PMOS transistor has its gate coupled to the gate and drain of the first PMOS transistor in a source-follower configuration so as to drive the source node of the second PMOS transistor to the predetermined potential. A reference PMOS transistor is coupled between $V_{CC}$ and the source node of the second PMOS transistor, with the gate of the reference PMOS transistor being commonly coupled to the gates of the PMOS load devices and to a reference potential. A NMOS current source device is coupled to the source of the second PMOS transistor such that a reference current flows through the reference PMOS transistor; this current is then mirrored through the PMOS load devices of the BiCMOS logic gate.

10 Claims, 2 Drawing Sheets

FIG_1
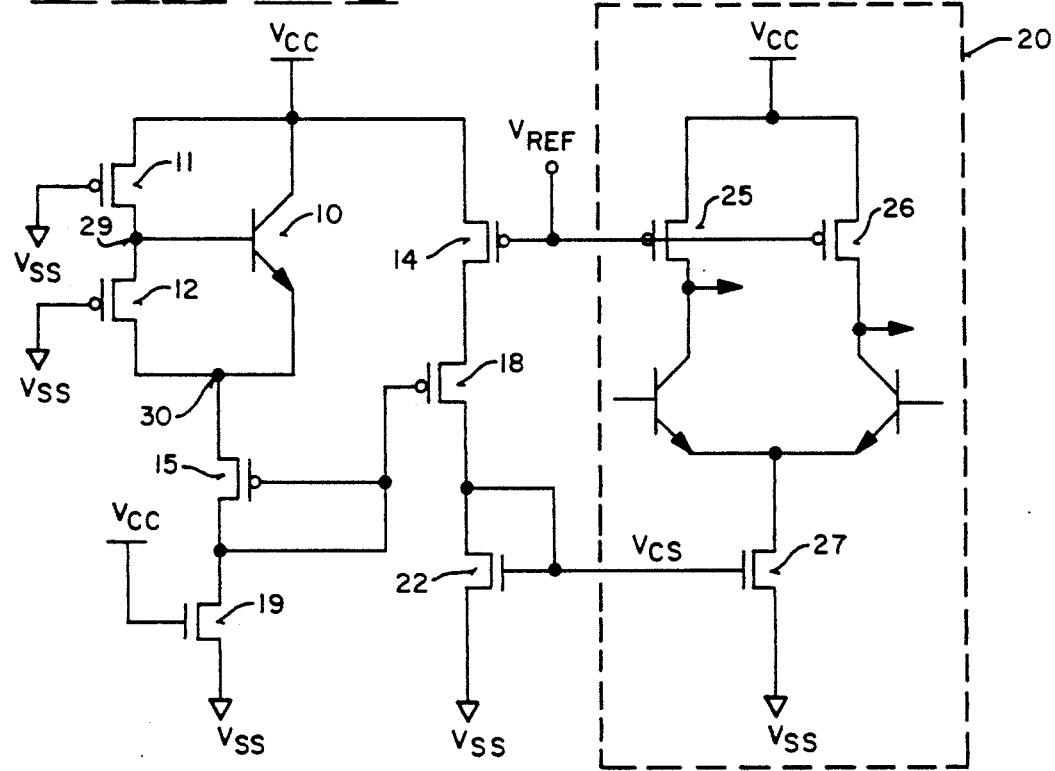
FIG_2
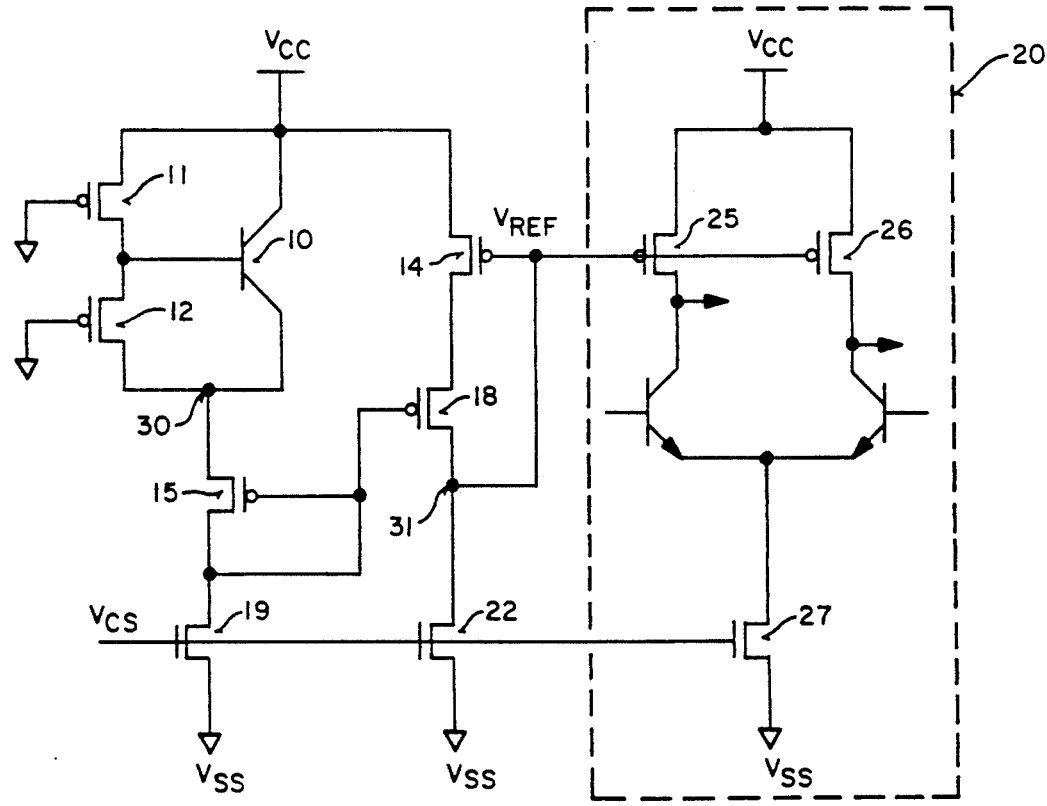

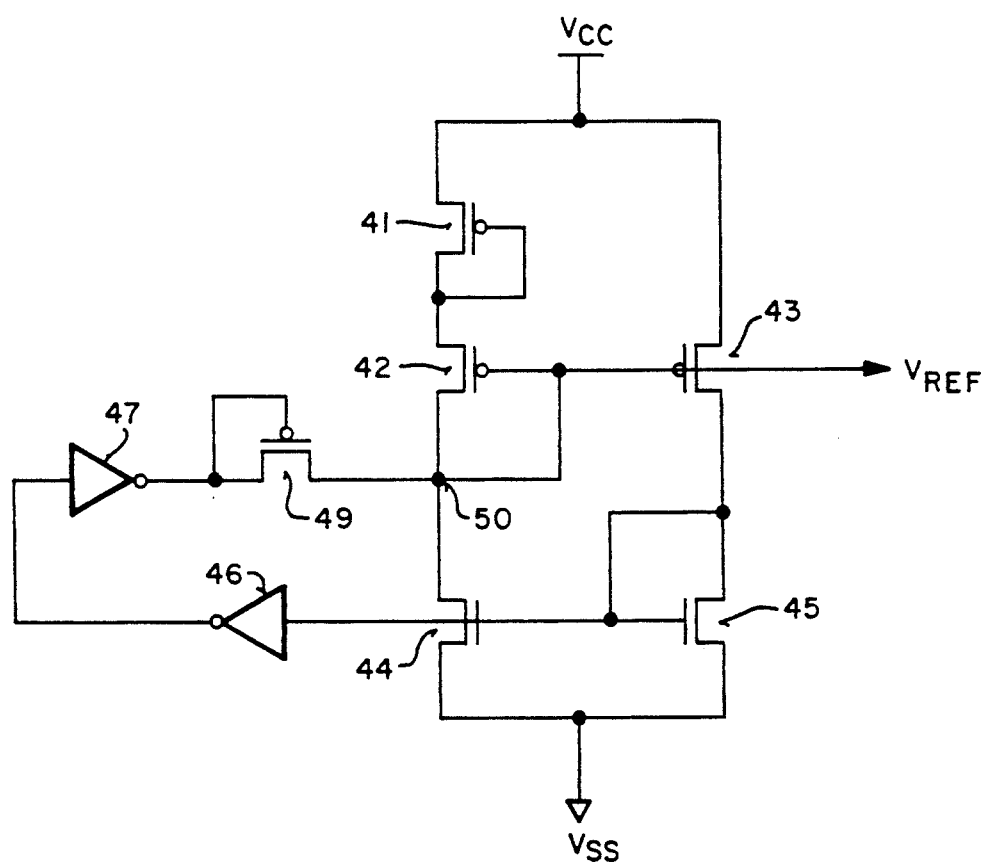
FIG_3

REFERENCE GENERATOR CIRCUIT FOR BICMOS ECL GATE EMPLOYING PMOS LOAD DEVICES

FIELD OF THE INVENTION

The present invention relates to the field of logic circuits; more particularly, to circuits fabricated on a substrate which includes both bipolar and metal-oxide semiconductor (MOS) devices.

BACKGROUND OF THE INVENTION

Circuits which combine bipolar and complementary metal-oxide semiconductor (CMOS) devices on the same silicon substrate are known as BiCMOS circuits. BiCMOS logic circuits share the advantages of both CMOS and bipolar circuitries. For example, BiCMOS circuits are characterized by extremely low quiescent power consumption, rail-to-rail output capability, high-density and high input impedance. At the same time, the bipolar elements provide very fast switching capabilities and feature good performance over temperature and power supply variations.

Emitter-coupled logic (ECL) is a popular family of bipolar logic circuitry which is found extensively in the prior art. Lately, researchers have attempted to create low cost BiCMOS ECL logic gates in order to take advantage of the faster bipolar logic switching capabilities while minimizing the quiescent power consumption by utilizing CMOS circuit devices. Whereas ECL processes can fabricate resistors for ECL circuits, BiCMOS processes typically do not include a resistor device, and must utilize CMOS devices instead. For example, U.S. Pat. No. 5,124,580 describes a BiCMOS logic circuit which includes an emitter-coupled pair of bipolar transistors connected to differentially compare an input signal with a reference potential. Each of the transistors is loaded by a p-channel MOS (PMOS) transistor operated in its linear region.

One of the drawbacks of prior art BiCMOS ECL logic circuits has been the inability to provide an appropriate reference circuit which maintains the PMOS load transistors in a linear region despite variations in current, temperature, process etc. Often, the difficulty lies in having the PMOS load devices track with the n-channel MOS (NMOS) devices which are typically used as current sources. Another problem has been the use of large voltage swings, sometimes as large as the power supply voltage, for switching between the logic voltage levels. Most crucial is the fact that large voltage swings add delay to the circuit, thereby diminishing performance. One of the advantages of ECL is that it uses small voltage swings. The large (power supply voltage) swings used in CMOS circuits add delay to the circuit, thereby diminishing performance. These large swings also generate more noise.

Yet another related problem occurs when the input voltage exceeds the output swing. This typically causes saturation of the input bipolar transistors, which also slows the device's speed considerably. At the other extreme, if the voltage swing is too small there can be a problem in maintaining a sufficient noise margin. Of course, all of the aforementioned problems are exacerbated by variations in temperature, voltage, and processing.

As will be seen, the present invention provides a reference circuit in conjunction with a BiCMOS ECL gate that allows the use of controlled, small voltage swings, and emitter-following to increase the speed of the logic gate.

SUMMARY OF THE INVENTION

The present invention covers a reference circuit for coupling to a particular type of BiCMOS logic gate. The logic gate includes a pair of emitter-coupled bipolar transistors that are each loaded by a corresponding PMOS load device; the load devices themselves are coupled to the positive supply potential, i.e., $V_{CC}$. The emitters of the bipolar transistors are commonly coupled to the negative supply potential, i.e., $V_{SS}$ or ground, through a NMOS current source device which sources current for the pair.

The invention provides a bias voltage for NMOS current source devices which tracks with a reference voltage coupled to the gates of one or more PMOS load transistors. The invented circuit functions by taking a reference potential, $V_{REF}$, and generating from that, a second reference potential, $V_{CS}$. With $V_{REF}$ being chosen to bias the PMOS load devices in their linear region, the invented circuit controls $V_{CS}$ so that a constant swing is generated at the output of the ECL logic gate.

The reference circuit itself comprises a $V_{be}$ multiplier coupled between $V_{CC}$ and a first internal node. The $V_{be}$ multiplier establishes a predetermined potential at the internal node which determines the voltage swing across the PMOS load devices. Also included in the reference circuit is a first PMOS transistor having its source coupled to the internal node. The first PMOS transistor is configured as a current source within the multiplier. A second PMOS transistor has its gate coupled to the gate and drain of the first PMOS transistor in a source-follower configuration so as to drive the source node of the second PMOS transistor to the predetermined potential. The reference circuit further comprises a reference PMOS transistor coupled between $V_{CC}$ and the source node of the second PMOS transistor. The gate of the reference PMOS transistor is commonly coupled to the gates of the PMOS load devices and to a reference potential.

A second NMOS transistor has its gate and drain coupled to the source of the second PMOS transistor. The source of the second NMOS transistor is coupled to $V_{SS}$ while its gate is coupled to the gate of the NMOS current source device. This means that the same reference current which flows through the reference PMOS transistor and the NMOS current source device is mirrored through the NMOS current source in the ECL gate.

BRIEF DESCRIPTION OF THE DRAWINGS

The present invention will be understood more fully from the detailed description which follows and from the accompanying drawings, which, however, should not be taken to limit the invention to the specific embodiments shown. They are for explanation and understanding only.

FIG. 1 is a circuit schematic diagram of one embodiment of the present invention.

FIG. 2 is a circuit schematic diagram of another embodiment of the present invention.

FIG. 3 is a schematic diagram of a circuit for generating a reference output voltage utilized by the circuits of FIGS. 1 and 2.

DETAILED DESCRIPTION

In the following description, a reference generator circuit for use with BiCMOS ECL gate devices is described in which numerous specific details are set forth, such as specific conductivity types, voltages, currents, etc., in order to provide a through understanding of the present invention. It should be understood, however, that these specific details need not be used to practice the present invention. In other instances, well-known structures and circuits have not been shown in detail in order to avoid obscuring the present invention with unnecessary detail.

Referring to FIG. 1, there is shown a circuit schematic diagram of the present invention which includes a BiCMOS ECL logic gate 20 comprising an emitter coupled pair of bipolar transistors coupled to an associated pair of PMOS load devices 25 and 26. Each of the PMOS load devices is coupled in series between the collector of one bipolar transistor and the supply voltage $V_{CC}$. The gates of PMOS transistors 25 and 26 are commonly coupled to a reference voltage $V_{REF}$. Current flow is established through the BiCMOS logic gate via NMOS transistor 27, which is shown being coupled between the emitters of the bipolar pair emitter follower transistors and the negative supply potential $V_{SS}$.

The reference generator circuit in FIG. 1 comprises a $V_{be}$ multiplier circuit which includes a bipolar transistor 10 having its base coupled to node 29, its emitter coupled to node 30 and its collector coupled to $V_{CC}$. A PMOS device 11 is shown coupled between $V_{CC}$ and node 29. Similarly, a PMOS device 12 is shown coupled between node 29 and node 30. Both of the gates of PMOS transistors 11 and 12 are coupled to $V_{SS}$. The dimensional relationship between transistors 11 and 12 are such that a voltage approximately equal to $V_{CC}-4/3$ Vbe is established at node 30. For example, to achieve this voltage in a current embodiment, the size of transistor 11 is made to be approximately three times larger than the size of transistor 12. It is appreciated that the $V_{be}$ multiplier circuit shown in FIG. 1 establishes the voltage swing for BiCMOS logic gate 20.

Coupled in series between node 30 and $V_{SS}$ are PMOS transistor 15 and NMOS transistor 19. The gate of transistor 19 is shown being coupled to $V_{CC}$, so as to establish current flow through the bipolar device 10. The source and gate node of transistor 15 are commonly connected to the gate of PMOS transistor 18. PMOS transistors 14 and 18 are coupled in series together with NMOS transistor 22 between supply voltages $V_{CC}$ and $V_{SS}$. The gate of PMOS transistor 14 is coupled to the reference voltage $V_{REF}$ and also to the gates of PMOS load transistors 25 and 26.

PMOS transistors 15 and 18 are configured so as to form a current mirror and source follower which forces a voltage at the source of PMOS transistor 14. The gate of device 14 is coupled to a reference potential $V_{REF}$, which fixes the resistance of device 14, as well as that of devices 25 and 26. Note that the current flowing through device 14 is mirrored into the BiCMOS logic gate 20 by virtue of NMOS transistors 22 and 27, which are configured as a current mirror. Thus, any variations in the PMOS load devices 25 and 26 which might causes changes in the output voltage level of gate 20, are compensated for by the reference generator circuit which mirrors the current present in the ECL gate.

Note that the current through PMOS device 14 is controlled indirectly. The reference voltage $V_{REF}$ controls the resistance of device 14 (and also the resistances of devices 25 and 26), while the $V_{be}$ multiplier and devices 15 and 18 force a voltage of $4/3$ $V_{be}$ across device 14. The current flow through device 14 is simply determined by ohms law (i=V/R).

The reference voltage $V_{REF}$ shown in FIG. 1 may be generated by a circuit such as that shown in FIG. 3. The generator circuit of FIG. 3 includes PMOS device 43 coupled in series with NMOS device 45 between $V_{CC}$ and $V_{SS}$. Similarly, PMOS devices 41 and 42 are shown coupled in series with NMOS device 44 between the two supply voltages $V_{CC}$ and $V_{SS}$. The gates of transistors 42 and 43 are commonly coupled to node 50 and provide the output reference voltage $V_{REF}$. Together, NMOS devices 44 and 45 form a current mirror. A start-up circuit for the reference generator of FIG. 3 includes inverter 46 coupled in series with inverter 47 and PMOS device 49. PMOS device 49 is coupled between the output of inverter 47 and node 50, with its gate tied to the output of inverter 47, whereas the input of inverter 46 is coupled to the gates of NMOS devices 44 and 45.

The purpose of the reference circuit of FIG. 3 is to generate a constant reference voltage with respect to $V_{CC}$ that is sufficiently large enough to maintain the operation of PMOS load transistors 25 and 26 in their linear region. In a current embodiment, the reference voltage output is approximately equal to $V_{CC}$-3 volts. Practitioners in the art will appreciate that the reference voltage $V_{REF}$ must be low enough so as to guarantee that PMOS transistors 25 and 26 stay operating in their linear region. At the same time, the reference voltage $V_{REF}$ must not be too low since this would limit operating voltage range. This limitation occurs because $V_{REF}$ cannot go below $V_{SS}$. Thus, the current embodiment can operate with a $V_{CC}$ of 3 volts or more.

Ignoring the start-up mechanism for the moment, the generator circuit of FIG. 3 has two stable operating modes. In one mode of operation, the PMOS device 43 operates with approximately ten times the current and two times the $V_{gs}$ of PMOS devices 41 and 42. This is achieved by appropriate sizing of devices 44 and 45. For example, a 10× current ratio can be achieved by making device 45 approximately ten times larger than device 44. Under this condition, the output voltage $V_{REF}$ is kept as a multiple of $V_T$. For the above ratios, the output reference voltage is approximately 3.7 $V_T$ (for a current embodiment $V_{REF}$ is approximately equal to $V_{CC}$-3 V).

The other stable mode of operation for the circuit of FIG. 3 arises under a condition in which no current flows anywhere, and the reference output voltage $V_{REF}$ is held at $V_{CC}$. This is the reason for the start-up circuitry comprising devices 46, 47 and 49. What the start-up circuit does is provide a leakage current which is sufficiently large so as to generate current flow through PMOS devices 41-43; this current flow then establishes the proper output voltage. For example, if the input of inverter 46 is initially at $V_{SS}$ (i.e., ground), then transistor 49 will initially be turned on to provide a leakage current at node 50. Eventually, as current begins to flow through the reference generator circuit, the voltage at the input of inverter 46 rises such that the output of inverter 47 increases in potential. Eventually, PMOS device 49 will turn off and the start-up circuit will be disabled.

It should be understood that although the circuit of FIG. 3 provides one way of establishing the reference voltage $V_{REF}$ used in the circuit of FIG. 1, numerous other alternatives are possible. In other words, the embodiment of FIG. 1 should not be construed as being limited to the use of the circuit of FIG. 3 for supplying the voltage reference $V_{REF}$.

The circuit of FIG. 2 is an alternative embodiment of the present invention, and is also useful for maintaining proper voltage swings and operating ranges in conjunction with a type of BiCMOS ECL gate employing PMOS load devices. FIG. 2 shows a circuit which takes a reference potential VCS and generates a second reference potential VREF. If VCS is chosen to control the current in the NMOS devicesk this circuit controls the resistance of the PMOS load devices to fix the swing of the ECL gate.

The embodiment of FIG. 2 includes the same $V_{be}$ multiplier circuit as shown in FIG. 1; comprising bipolar transistor 10 and PMOS devices 11 and 12. Likewise, the embodiment of FIG. 2 includes current mirror and source follower devices 15 and 18. NMOS device 19, however, is shown in FIG. 2 as having its gate commonly coupled to NMOS transistors 22 and 27, which may be coupled to an ordinary common voltage bias line. The voltage bias on the gate of transistor 19 establishes the current flow through the $V_{be}$ multiplier as well as the current through the BiCMOS ECL gate 20. The gates of PMOS devices 14, 25, and 26 are coupled to $V_{REF}$ at the source of PMOS device 18.

The main difference of the embodiment of FIG. 2 over that shown in FIG. 1 is that in the circuit of FIG. 1, the current source for the $V_{be}$ multiplier comprises an NMOS transistor 19 having its gate connected directly to $V_{CC}$. This means that there is always a large quiescent current flowing through the $V_{be}$ multiplier during normal operation. Hence, in a large scale integrated circuit a substantial amount of power may be wasted.

The large quiescent current flow is substantially reduced in the embodiment of FIG. 2 by means of current source transistors 19, 22, and 27. These transistors are controlled by a voltage bias that has a voltage potential that is substantially less than the supply voltage $V_{CC}$. A typical value of the bias voltage which might be coupled to transistors 19,22 and 27 is in the range 1-2 volts.

Furthermore, in the embodiment of FIG. 2, practitioners in the art will appreciate that the NMOS current source transistors 19, 22, and 27 control the PMOS devices 14, 25, and 26. In other words, whereas the resistance of the PMOS devices 14, 25, and 26 in the embodiment of FIG. 1 basically determine the current flow through the BiCMOS gate, in the alternative embodiment of FIG. 2, it is current flow that determines the resistance of the PMOS load devices. Because the current flow is controlled either externally or through a conventional bias circuit, the circuit of FIG. 2 offers the advantage of a substantial power savings.

As was the case with the embodiment of FIG. 1, the circuit of FIG. 2 also establishes the voltage swing for the BiCMOS gate 20 by means of a $V_{be}$ multiplier. The $V_{be}$ multiplier establishes a voltage of approximately $V_{CC}$-4/3 Vbe at node 30. Because this voltage is forced onto the source node of PMOS transistor 14, it causes the PMOS load devices 25 and 26 to track with the NMOS current source transistor 27. In other words, the resistances of load devices 25 and 26 are maintained in a linear operating range by means of an externally-controlled NMOS current source transistor 27.

Whereas many alternations and modifications to the present invention will no doubt become apparent to the person of ordinary skill in the art after having read the foregoing description, it is to be understood that the particular embodiments shown and described by way of illustration are in no way intended to be limiting. Therefore, reference to the details of the illustrated diagrams is not intended to limit the scope of the claims which themselves recite only those features regarded as essential to the invention.

I claim:

1. A reference circuit coupled to a BiCMOS logic gate, said gate including a pair of emitter coupled bipolar transistors, each loaded by a corresponding PMOS load device coupled to a first supply potential, the emitters of said bipolar transistors being commonly coupled to a second supply potential through a NMOS current source device which sources current for said pair, and wherein said first supply potential is higher than said second supply potential, said reference circuit comprising:

a $V_{be}$ multiplier coupled between said first supply potential and a first internal node, said multiplier establishing a predetermined voltage at said internal node which determines the voltage swing across said PMOS load devices;

a first PMOS transistor having its source coupled to said internal node;

a first NMOS transistor coupled in series with said first PMOS transistor and configured as a current source for said multiplier;

a second PMOS transistor having its gate coupled to the gate and drain of said first PMOS transistor in a source follower configuration so as to drive the source node of said second PMOS transistor to said predetermined potential;

a reference PMOS transistor coupled between said first supply potential and said source node of said second PMOS transistor, the gate of said reference PMOS transistor being commonly coupled to the gates of said PMOS load devices and to a reference potential;

a second NMOS transistor having its gate and drain coupled to the drain of said second PMOS transistor, said second NMOS transistor also having its source coupled to said second supply potential and its gate coupled to the gate of said NMOS current source device such that the reference current flowing through said reference PMOS transistor and said second NMOS transistor is mirrored through said PMOS load devices and said NMOS current source device.

2. The reference circuit of claim 1 wherein said first supply potential is equal to $V_{CC}$ and said second supply potential is equal to ground.

3. The reference circuit of claim 2 wherein said $V_{be}$ multiplier comprises:

a reference bipolar transistor having its collector coupled to said first supply potential, its emitter coupled to said internal node, and its base coupled to a second internal node;

a third PMOS device coupled between said first supply potential and said second internal node;

a fourth PMOS device coupled between said internal node and said second internal node, the gates of said third and forth PMOS transistors being coupled to said second supply potential, and further wherein the device size ratio between said third and fourth PMOS transistors is approximately 3:1.

4. The reference circuit of claim 3 wherein said predetermined voltage is approximately equal to $V_{CC}-4/3\ V_{be}$.

5. The reference circuit of claim 4 wherein said reference potential is approximately equal to $V_{CC}-3$ volts.

6. A reference circuit coupled to a BiCMOS logic gate, said gate including a pair of emitter coupled bipolar transistors, each loaded by a corresponding PMOS load device coupled to a first supply potential, the emitters of said bipolar transistors being commonly coupled to a second supply potential through a NMOS current source device which sources current for said logic gate, wherein said first supply potential is higher than said second supply potential, said reference circuit comprising:

a $V_{be}$ multiplier coupled between said first supply potential and an first internal node, said multiplier establishing a predetermined voltage at said first internal node which determines the voltage swing across said PMOS load transistors;

first and second NMOS transistors having their sources coupled to said second supply potential and their gates commonly coupled to the gate of said NMOS current source device and to a first reference potential;

a first PMOS transistor having its source coupled to said first internal mode and its gate and drain coupled to the drain of said first NMOS transistor;

a second PMOS transistor having its gate coupled to the gate of said first PMOS transistor, its drain coupled to the drain of second NMOS transistor, and its source coupled to said first supply potential through the drain of a reference PMOS transistor, said first and second PMOS transistors forming a current mirror and source follower for said reference circuit;

the gate of said reference PMOS transistor being commonly coupled to the gates of said PMOS load devices and to the drain of said second PMOS transistor such that the reference current flowing through said reference PMOS transistor, said second PMOS transistor, and said second NMOS transistor is the same as the current flowing through said PMOS load devices and said NMOS current source device.

7. The reference circuit of claim 6 wherein said first supply potential is equal to $V_{CC}$ and said second supply potential is equal to ground.

8. The reference circuit of claim 7 wherein said $V_{be}$ multiplier comprises:

a reference bipolar transistor having its collector coupled to said first supply potential, its emitter coupled to said internal node, and its base coupled to a second internal node;

a third PMOS device coupled between said first supply potential and said second internal node;

a fourth PMOS device coupled between said internal node and said second internal node, the gates of said third and fourth PMOS transistors being coupled to said second supply potential, and further wherein the device size ratio between said third and fourth PMOS transistors is approximately 3:1.

9. The reference circuit of claim 8 wherein said predetermined voltage is approximately equal to $V_{CC}-4/3\ V_{be}$.

10. The reference circuit of claim 9 wherein said reference potential is approximately equal to $V_{CC}-3$ volts.

* * * * *